(12) United States Patent
Wei et al.

(10) Patent No.: US 11,424,295 B2
(45) Date of Patent: Aug. 23, 2022

(54) DISPLAY SUBSTRATE WITH SUB-PIXEL VIRTUAL IMAGES BEING CONNECTED WITH EACH OTHER, PREPARATION METHOD THEREOF, AND DISPLAY APPARATUS

(71) Applicant: BOE Technology Group Co., Ltd., Beijing (CN)

(72) Inventors: Junbo Wei, Beijing (CN); Shengji Yang, Beijing (CN); Kuanta Huang, Beijing (CN); Pengcheng Lu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 32 days.

(21) Appl. No.: 16/903,347

(22) Filed: Jun. 16, 2020

(65) Prior Publication Data

US 2021/0091142 A1 Mar. 25, 2021

(30) Foreign Application Priority Data

Sep. 25, 2019 (CN) .......................... 201910913101.0

(51) Int. Cl.
*H01L 29/08* (2006.01)
*H01L 27/32* (2006.01)
(Continued)

(52) U.S. Cl.
CPC ........ *H01L 27/322* (2013.01); *H01L 51/5237* (2013.01); *H01L 51/56* (2013.01)

(58) Field of Classification Search
CPC .................................................. H01L 27/322
See application file for complete search history.

(56) References Cited

U.S. PATENT DOCUMENTS

| 11,002,888 B2* | 5/2021 | Ma .......................... G02B 5/201 |
| 2014/0145177 A1* | 5/2014 | Lee .................... H01L 29/78696 438/34 |

(Continued)

FOREIGN PATENT DOCUMENTS

| CN | 101424788 A | 5/2009 |
| CN | 106291944 A | 1/2017 |
| CN | 108563014 A | 9/2018 |

OTHER PUBLICATIONS

Office Action dated Jun. 24, 2021 for Chinese Patent Application No. 201910913101.0 and English Translation.

*Primary Examiner* — Caleb E Henry
(74) *Attorney, Agent, or Firm* — Ling Wu; Stephen Yang; Ling and Yang Intellectual Property

(57) ABSTRACT

Provided are a display substrate, a preparation method thereof, and a display apparatus. The display substrate includes: a base substrate, a light emitting structure layer disposed on the base substrate, a color filter layer including a plurality of sub-pixels and disposed on a light emitting side of the light emitting structure layer, and a pinhole thin film structure layer disposed on a light emitting side of the color filter layer, the pinhole thin film structure layer including a plurality of amplification structures, the amplification structures corresponding to the sub-pixels one by one, and an orthographic projection of the amplification structures on the base substrate being inside an orthographic projection of the sub-pixels corresponding to the amplification structures on the base substrate, and the amplification structures being configured to amplify images of the sub-pixels corresponding to the amplification structures.

18 Claims, 3 Drawing Sheets

(51) Int. Cl.
*H01L 51/52* (2006.01)
*H01L 51/56* (2006.01)

(56) References Cited

U.S. PATENT DOCUMENTS

2014/0346498 A1* 11/2014 Ahn .................. H01L 29/66969
 257/43
2017/0213872 A1* 7/2017 Jinbo .................. H01L 51/5246
2018/0113302 A1 4/2018 Wu et al.

* cited by examiner

US 11,424,295 B2

DISPLAY SUBSTRATE WITH SUB-PIXEL VIRTUAL IMAGES BEING CONNECTED WITH EACH OTHER, PREPARATION METHOD THEREOF, AND DISPLAY APPARATUS

CROSS-REFERENCE TO RELATED APPLICATION

The present application claims the priority of Chinese Patent Application No. 201919131010.0 filed to the CNIPA on Sep. 25, 2019, the entire content of which is hereby incorporated by reference.

TECHNICAL FIELD

Embodiments of the present application relate to but are not limited to a display substrate, a preparation method thereof and a display apparatus.

BACKGROUND

An Organic Light-Emitting Diode (OLED) is a new OLED display apparatus based on a silicon substrate. A Silicon-based OLED has the characteristics of high Pixels Per Inch (PPI), a small volume and high contrast, is made by a mature integrated circuit Complementary Metal Oxide Semiconductor (CMOS) process, realizes active addressing of pixels, and has Logic Board (TCON), One Time Programmable (OTP) and other circuits, and realizes a light weight. The Silicon-based OLED is widely used in the fields of near-eye display, virtual reality and augmented reality, especially in Augmented Reality (AR)/Virtual Reality (VR) head-mounted display apparatuses. With the development of big data and information interaction technology, a virtual reality technology is widely used. The VR technology is a 3D dynamic scene reconstruction technology of human-computer interaction type that combines multiple types of information and technologies. Users may devote themselves to virtual environment and immerse themselves in virtual simulation scenes. In order to enhance the human-computer interaction experience of VR display apparatuses, it is necessary to enhance immersion feeling of a user, which is also the technical difficulty of VR technology innovation. The realization of high PPI in OLED display apparatuses to achieve higher display quality is a focus of research and technology development in the industry.

SUMMARY

The following is a summary of the subject matter described in detail herein. The summary is not intended to limit the protection scope of the claims.

In one aspect, an embodiment of the present application provides a display substrate, including a base substrate, a light emitting structure layer disposed on the base substrate, a color filter layer including a plurality of sub-pixels and disposed on the light emitting side of the light emitting structure layer, and a pinhole thin film structure layer disposed on the light emitting side of the color filter layer, wherein the pinhole thin film structure layer including a plurality of amplification structures, and the amplification structures corresponding to the sub-pixels one by one, and an orthographic projection of the amplification structures on the base substrate being inside an orthographic projection of the sub-pixels corresponding to the amplification structures on the base substrate, and the amplification structures being configured to amplify images of the sub-pixels corresponding to the amplification structures.

In an exemplary embodiment, a section of the amplification structures is rectangular, or may be trapezoidal, inverted trapezoidal, or square, on a plane perpendicular to the base substrate.

In an exemplary embodiment, lines connecting the centers of the amplification structures and the centers of the sub-pixels corresponding to the amplification structures are perpendicular to the base substrate.

In an exemplary embodiment, the section of the amplification structures is circular on a plane parallel to the base substrate.

In an exemplary embodiment, sub-pixel virtual images formed after adjacent amplification structures amplify the sub-pixels corresponding to the amplification structures are connected with each other.

In an exemplary embodiment, a material of the amplification structures includes titanium.

In an exemplary embodiment, the pinhole thin film structure layer further includes a main body structure, wherein the main body structure includes via holes corresponding to the amplification structures one by one to accommodate the amplification structures, and the via holes are the same in size as the amplification structures corresponding to the via holes.

In an exemplary embodiment, a refractive index of the material used by the main body structure is smaller than a refractive index of the material used by the amplification structures.

In an exemplary embodiment, the base substrate includes a silicon substrate.

In an exemplary embodiment, the light emitting structure layer includes a first electrode layer, a pixel driving circuit layer, an organic light emitting layer, a second electrode layer, and a first encapsulation layer sequentially set on the base substrate. The first electrode layer is for example an anode and the second electrode layer is for example a cathode.

In another aspect, an embodiment of the present application provides a display apparatus including a display substrate as described in any of the above embodiments.

In yet another aspect, an embodiment of the present application further provides a preparation method of a display substrate, including: forming a base substrate and forming a light emitting structure layer disposed on the base substrate; forming a color filter layer including a plurality of sub-pixels and disposed on the light emitting side of the light emitting structure layer; and forming a pinhole thin film structure layer disposed on the light emitting side of the color filter layer, wherein the pinhole thin film structure layer including a plurality of amplification structures, the amplification structures corresponding to the sub-pixels one by one, an orthographic projection of the amplification structures on the base substrate being inside the orthographic projection of the sub-pixels corresponding to the amplification structures on the base substrate, and the amplification structures being configured to amplify images of the sub-pixels corresponding to the amplification structures.

In an exemplary embodiment, sub-pixel virtual images formed after adjacent amplification structures amplify the sub-pixels corresponding to the amplification structures are connected with each other.

In an exemplary embodiment, a section of the amplification structures is rectangular on a plane perpendicular to the base substrate.

In an exemplary embodiment, the section of the amplification structures is circular on a plane parallel to the base substrate.

In an exemplary embodiment, lines connecting centers of the amplification structures and centers of the sub-pixels corresponding to the amplification structures are perpendicular to the base substrate.

In an exemplary embodiment, a material of the amplification structures includes titanium.

In an exemplary embodiment, the pinhole thin film structure layer further includes a main body structure, wherein the main body structure including via holes corresponding to the amplification structures one by one to accommodate the amplification structures, and the via holes being the same in size as the amplification structures corresponding to the via holes.

In an exemplary embodiment, a refractive index of the material used by the main body structure is smaller than a refractive index of the material used by the amplification structures.

In an exemplary embodiment, the base substrate includes a silicon substrate.

Other aspects will become apparent upon reading and understanding the drawings and detailed description.

Other features and advantages of the present application will be set forth in the following description, and in part will become apparent from the description, or may be learned by practice of the present application. Purposes and other advantages of the technical solutions of the present application may be realized and acquired by structures specified in the specification, claims and drawings.

BRIEF DESCRIPTION OF DRAWINGS

Accompanying drawings are used to provide a further understanding of technical solutions of the present application, form a part of the specification, and explain technical solutions of the present application together with embodiments of the present application, while they do not constitute a limitation on the technical solutions of the present application.

DETAILED DESCRIPTION

Embodiments of the present application will be described in detail with reference to the accompanying drawings. Without conflict, embodiments of the present application and features in the embodiments may be combined with each other arbitrarily.

The steps shown in the flowchart of the drawings may be performed in a computer system such as a set of computer executable instructions. Although a logical sequence is shown in the flowchart, in some cases, the steps shown or described may be performed in a sequence different from that herein.

Unless otherwise defined, technical terms or scientific terms used in this disclosure shall have the ordinary meaning understood by those of ordinary skills in the art to which this disclosure pertains. The words "first", "second" and the like used in this disclosure do not indicate any order, quantity, or importance, but are only used to distinguish different components. Similar words such as "including" or "comprising" mean that the elements or articles appearing before the word cover the elements or articles listed after the word and their equivalents, and do not exclude other elements or articles. Similar words such as "connecting" or "connected" are not limited to physical connections or mechanical connections, but may include electrical connections, whether direct or indirect. "Up", "Down", "Left", and "Right" are only used to indicate a relative positional relationship. When an absolute position of a described object is changed, a relative positional relationship may change accordingly.

In order to realize high PPI and high contrast of a picture, a Thin Film Transistor (TFT) driving unit may be added to an OLED display apparatus. A current glass-based OLED display apparatus is large in size and difficult to realize high PPI, and a screen window effect phenomenon exists in a silicon-based OLED display apparatus. An embodiment of the present application provides a display apparatus capable of eliminating the screen window effect. A pinhole film structure layer is integrally designed on a base substrate to realize electromechanical integration microstructure design. Through pinhole film technology and CMOS process, the apparatus has the characteristics of a small volume, a high integration degree, and good compactness. When displaying an image of a picture, the screen window effect is eliminated, the display stereoscopic effect of the picture is enhanced, immersion feeling and experience feeling of users are improved, and high-quality near-eye display effect may be realized.

Figure 1:
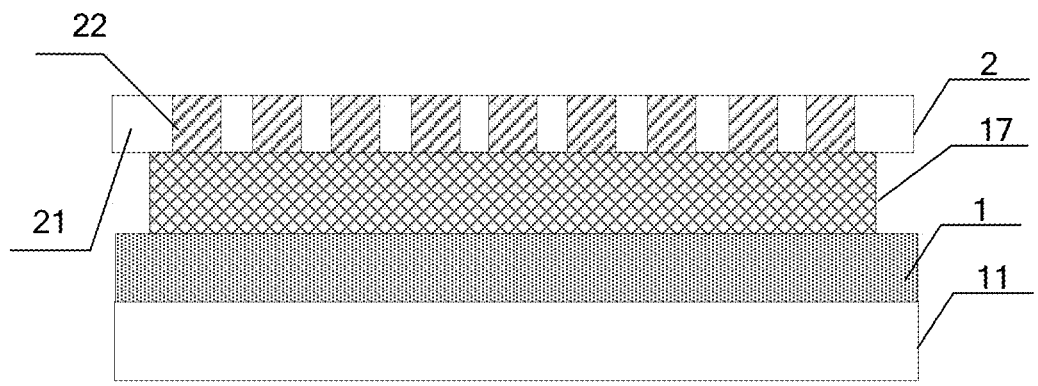
FIG. 1 is a schematic diagram of a display substrate according to an embodiment of the present application.

As shown in FIG. 1, an embodiment of the present application provides a display substrate including a base substrate 11, a light emitting structure layer 1 disposed on the base substrate 11, a color filter layer 17 including a plurality of sub-pixels and disposed on a light emitting side of the light emitting structure layer 1, and a pinhole film structure layer 2 disposed on a light emitting side of the color filter layer 17, wherein the pinhole film structure layer 2 includes a plurality of amplification structures 22, and the amplification structures 22 correspond to the sub-pixels one by one, and an orthographic projection of the amplification structures 22 on the base substrate 11 is inside an orthographic projection of the sub-pixels corresponding to the amplification structures 22 on the base substrate 11, and the amplification structures 22 are configured to amplify images of the sub-pixels corresponding to the amplification structures 22.

Since the color filter layer 17 does not emit light itself, the light emitting side of the color filter layer 17 refers to a direction in which light is emitted when the display substrate works.

According to the solution provided by the embodiment, the amplification structures 22 amplify the images of the sub-pixels to acquire virtual images, and compared with a direct output display of the images of the sub-pixels, a distance between virtual images of adjacent sub-pixels is reduced or even disappears, thus eliminating a gap between the images of the adjacent sub-pixels and reducing or eliminating the screen window effect. In addition, the pinhole film structure layer 2 may work under natural conditions without a need to provide an additional driving component.

Figure 2:
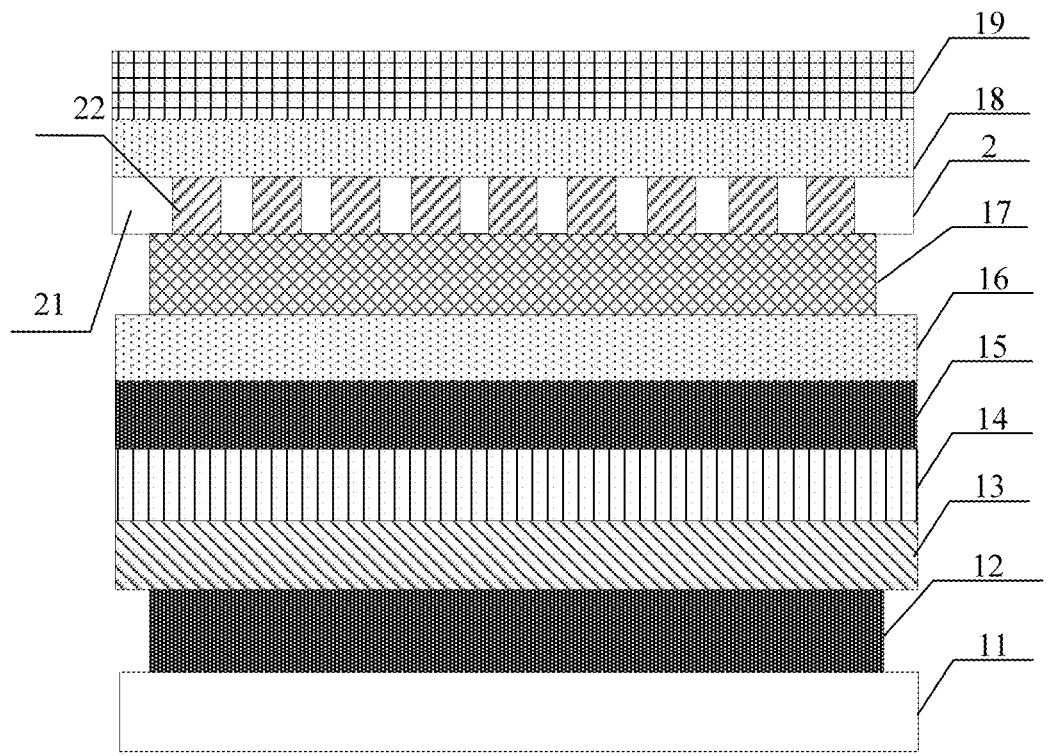
FIG. 2 is a schematic diagram of a display substrate according to another embodiment.

As shown in FIG. 2, the present embodiment provides a display substrate including a base substrate 11 (in this embodiment, the base substrate 11 is a silicon substrate), an anode 12 disposed on the substrate 11, a pixel driving circuit 13 disposed on the anode 12, an organic light emitting layer 14 disposed on the pixel driving circuit 13, a cathode 15 disposed on the organic light emitting layer 14, a first encapsulation layer 16 disposed on the cathode 15, a color filter layer 17 including a plurality of sub-pixels and disposed on the first encapsulation layer 16, a pinhole film structure layer 2 disposed on the color filter layer 17, a second encapsulation layer 18 disposed on the pinhole film structure layer 2, and a cover plate 19 disposed on the second encapsulation layer 18. The pinhole thin film structure layer 2 includes a main body structure 21 and a plurality of amplification structures 22, wherein the main structure 21 includes via holes corresponding to the amplification structures 22 one by one to accommodate the amplification structures 22, the via holes are the same in size as the amplification structures 22 corresponding to the via holes, the amplification structures 22 correspond to the sub-pixels one by one, and an orthographic projection of the amplification structures 22 on the base substrate 11 is inside an orthographic projection of the sub-pixels corresponding to the amplification structures 22 on the base substrate 11, the amplification structures 22 are configured to amplify images of the sub-pixels corresponding to the amplification structures 22, and the display apparatus may be a multi-layer structure and manufactured in a stacking manner.

In an exemplary embodiment, the anode 12 may be Indium tin oxide (ITO). Of course, other electrode materials may be used, and embodiments of the present application are not limited thereto.

In an exemplary embodiment, the pixel driving circuit 13 may be fabricated on the base substrate 11 using a CMOS process.

In an exemplary embodiment, the organic light-emitting layer 14 may be made of an organic material, and utilizes the light-emitting characteristics of the material to realize light emission under voltage or current drive.

According to the solution provided by the embodiment, a pixel image is amplified by the amplification structure, and a virtual image of a pixel image is output to display, thereby realizing a function of eliminating a screen window effect. In addition, a silicon substrate is adopted, so that a volume is small and a resolution is high; a pinhole film structure is integrated on the silicon substrate to form an electromechanical integrated microstructure; the pinhole film technology and the CMOS process are adopted to simplify a structure and reduce the cost, and display quality of the image is improved, thereby realizing a light and thin design.

In an exemplary embodiment, the color filter layer 17 is, for example, a RGB color filter layer, and the RGB color filter layer includes color filters of the RGB colors configured to filter light transmitted through the color filters to generate light of different colors for color display, for example, light of RGB colors is respectively generated to realize colorized display of emitted light. The color filter layer 17 includes a plurality of pixel units (corresponding to pixel units of the organic light emitting layer 14 one by one), and each pixel unit includes a sub-pixel R, a sub-pixel G, and a sub-pixel B.

In an exemplary embodiment, the base substrate 11 may include a silicon substrate, and embodiments of the present application are not limited thereto. In other embodiments, the base substrate 11 may be other type of substrate, such as a glass substrate.

In an exemplary embodiment, a section of the amplification structures 22 may be rectangular on a plane perpendicular to the base substrate 11, as shown in FIG. 2. This structure is only an example, and the section of the amplification structures 22 may be of another shape, such as trapezoidal, or inverted trapezoidal.

Figure 3:
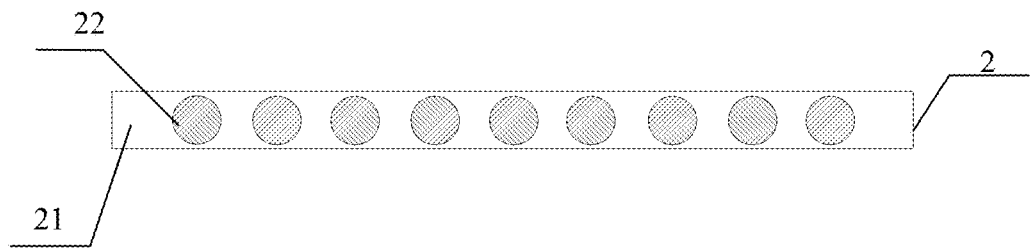
FIG. 3 is a schematic diagram of an amplification structure according to an embodiment.

In an exemplary embodiment, as shown in FIG. 3, a section of the amplification structures 22 may be circular on a plane parallel to the base substrate 11. In other embodiments, the section of the amplification structures 22 may be oval, square, or the like on a plane parallel to the base substrate 11.

In an exemplary embodiment, the amplification structure 22 may be made of a material with high light transmittance, for example, the amplification structure 22 is made of titanium (Ti). Embodiments of the present application are not limited to this, and another material with high light transmittance may be used, such as an electro wetting material and a polycarbonate material.

In an exemplary embodiment, a refractive index of a material used by the main body structure 21 is smaller than that of a material used by the amplification structures. For example, the main body structure 21 is made of at least one of silicon oxide or silicon nitride, for example, silicon dioxide, or silicon nitride.

In an exemplary embodiment, lines connecting centers of the amplification structures 22 and centers of the sub-pixels corresponding to the amplification structures 22 may be perpendicular to the base substrate 11. In other embodiments, the lines connecting the centers of the amplification structures 22 and the centers of the sub-pixels corresponding to the amplification structures 22 may not be perpendicular to the base substrate 11. When the lines connecting the centers of the amplification structures 22 and the centers of the sub-pixels corresponding to the amplification structures 22 are perpendicular to the base substrate 11, it is more effective for eliminating the screen window effect.

Figure 4:
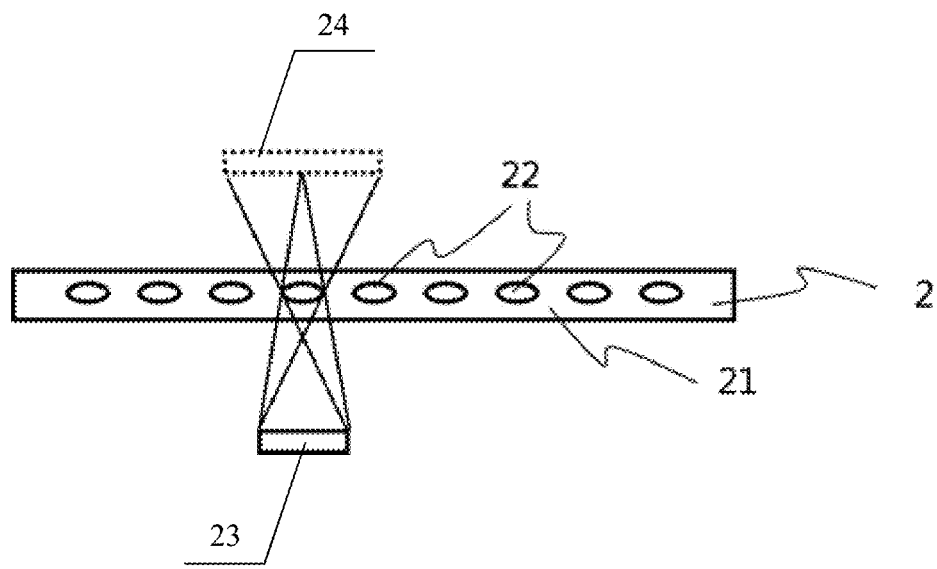
FIG. 4 is an amplified schematic diagram of an amplification structure according to an embodiment.

The amplification structures 22 have amplification and polymerization functions on light, thereby improving an efficiency of light extraction. FIG. 4 is a schematic diagram of images of the sub-pixels amplified by the amplification structures 22. As shown in FIG. 4, the sub-pixel 23 is amplified by the amplification structure 22 to acquire a sub-pixel virtual image 24. It can be seen that the sub-pixel 23 is amplified so as to cover a position of a black matrix and eliminate the screen window effect.

Figure 5:
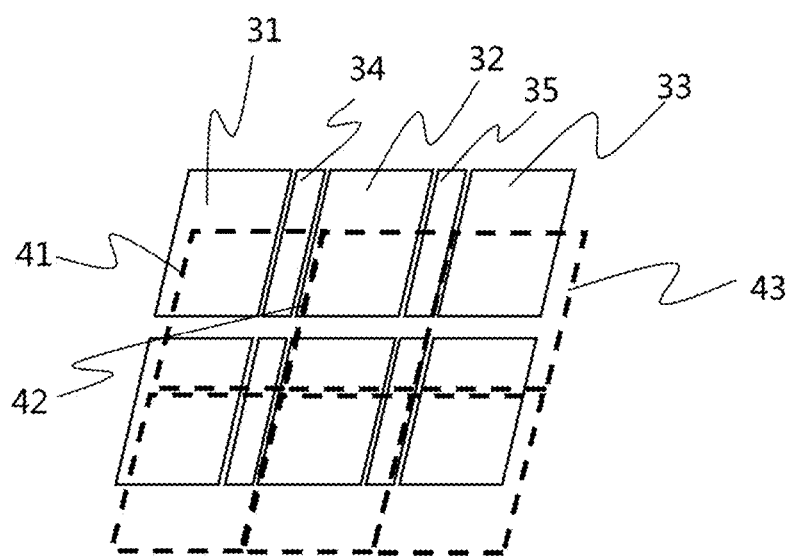
FIG. 5 is a schematic diagram of a sub-pixel virtual image according to an embodiment.

In an exemplary embodiment, sub-pixel virtual images formed after adjacent amplification structures 22 amplifying the sub-pixels corresponding to the amplification structures 22 are connected with each other. As shown in FIG. 5, the color filter layer 17 includes a sub-pixel 31(R), a sub-pixel 32(G), and a sub-pixel 33(B), an isolation black matrix (BM) is arranged among the sub-pixels: a first black matrix 34 and a second black matrix 35, and the first black matrix 34 isolates the sub-pixels 31 and 32, the second black matrix 35 isolates the sub-pixels 32 and 33. The sub-pixel 31 is amplified by the pinhole thin film structure layer 2 to acquire a virtual image 41, the sub-pixel 32 is amplified by the pinhole thin film structure layer 2 to acquire a virtual image 42, and the sub-pixel 33 is amplified by the pinhole thin film structure layer 2 to acquire a virtual image 43. It can be seen that the virtual image 41 and the virtual image 42 are connected with each other, and the virtual image 42 and the virtual image 43 are connected with each other, that is, the virtual images of the sub-pixels are connected with each other without a gap. Compared with directly outputting the images of the sub-pixel 31, the sub-pixel 32, and the sub-pixel 33, the virtual images 41, 42 and 43 of the pixel images are transmitted outward and displayed, so that display quality may be improved and the screen window effect may be eliminated. In another embodiment, sub-pixel virtual images formed after adjacent amplification structures 22 amplifying the sub-pixels corresponding to the amplification structures 22 may not be connected with each other. At this time, the screen window effect is only partially eliminated.

The second encapsulation layer 18 and the cover plate 19 may protect the thin film structure layer 2 and the color filter layer 17 from water, oxygen and the like.

In an exemplary embodiment, the second encapsulation layer 18 may adopt a thin film layer structure combining an organic material and an inorganic material, which may effectively prevent erosion of water and oxygen.

In an exemplary embodiment, the cover plate 19 is, for example, a glass cover plate, and a high transmittance plain glass may be used.

In this embodiment, the pinhole effect thin film structure layer is utilized to realize amplification of the pixel image of the display substrate, and an original pixel image is output to the pinhole thin film structure layer to realize amplification of the original pixel image, and eliminate the display of the black matrix (BM), and the pinhole thin film structure layer is integrated with the silicon-based OLED display apparatus to improve display quality, reduce a volume and improve compactness of the system. The display substrate provided by the embodiment may realize the functions of improving the screen display and eliminating the screen window effect, enhance stereoscopic display effect of the screen, and improve the experience and immersion feeling of VR/AR users.

In another embodiment, an encapsulation layer may be disposed between the color filter layer 17 and the pinhole film structure layer 2.

In another embodiment, the pinhole thin film structure layer 2 may be other structures in which a plurality of hemispherical structures (i.e., amplification structures) are formed on the surface of the main body structure, and sub-pixels are amplified by the hemispherical structures. Positions of the hemispherical structures are similar to that of the amplification structures in the previous embodiment and will not be described again.

In the previous embodiment, a silicon substrate OLED display apparatus is taken as an example for explanation, but embodiments of the present application are not limited to this, and another display apparatus may be adopted, such as, a non-silicon substrate OLED display apparatus and a non-organic light emitting display apparatus. Similar to the implementation in the embodiment, a pinhole film structure layer may be disposed on the light emitting side of the color filter layer.

Figure 6:
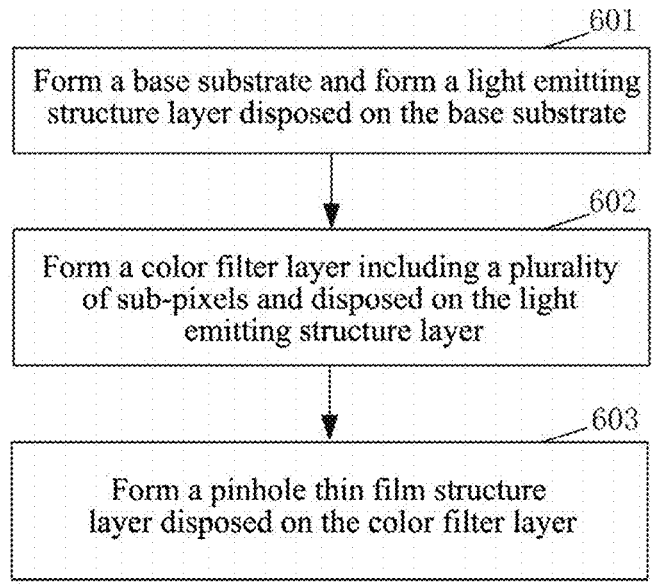
FIG. 6 is a flowchart of a preparation method of a display substrate according to an embodiment.

Based on the same inventive concept, as shown in FIG. 6, an embodiment of the present application provides a preparation method of a display substrate, including steps 601-603.

In 601, a base substrate is formed and a light emitting structure layer disposed on the base substrate is formed.

In 602, a color filter layer including a plurality of sub-pixels and disposed on the light emitting side of the light emitting structure layer is formed.

In 603, a pinhole thin film structure layer disposed on the light emitting side of the color filter layer is formed, the pinhole thin film structure layer includes a plurality of amplification structures, the amplification structures correspond to the sub-pixels one by one, an orthographic projection of the amplification structures on the base substrate is inside an orthographic projection of the sub-pixels corresponding to the amplification structures on the base substrate, and the amplification structures are configured to amplify images of the sub-pixels corresponding to the amplification structures.

In an exemplary embodiment, sub-pixel virtual images formed after adjacent amplification structures amplify sub-pixels corresponding to the amplification structures may be connected with each other.

In an exemplary embodiment, a section of the amplification structures may be rectangular on a plane perpendicular to the base substrate.

In an exemplary embodiment, a section of the amplification structures may be circular on a plane parallel to the base substrate.

In an exemplary embodiment, lines connecting centers of the amplification structures and centers of the sub-pixels corresponding to the amplification structures may be perpendicular to the base substrate.

In an exemplary embodiment, a material of the amplification structures may include titanium.

In an exemplary embodiment, the pinhole film structure layer may further include a main body structure including via holes corresponding to the amplification structures one by one to accommodate the amplification structures, and the via holes are the same size as the amplification structures corresponding to the via holes.

In an exemplary embodiment, a refractive index of the material used by the main body structure may be smaller than a refractive index of the material used by the amplification structures.

In an exemplary embodiment, the base substrate may include a silicon substrate.

When the base substrate is a silicon substrate, a thin film material layer may be integrated and designed on the silicon substrate by adopting Micro-Electro-Mechanical System (MEMS) process technology, which has the characteristics of a chemical corrosion resistance, a good integration degree and a small volume, may be etched in a silicon-based OLED device, and has a high integration degree of a display system.

The preparation method of the display substrate provided by the embodiment reduces gaps among adjacent sub-pixel images, reduces or even eliminates a screen window effect caused by the black matrix, by adding the pinhole film structure layer on the light emitting side of the color filter layer and outputting the sub-pixel images after amplifying. The preparation method of the embodiment may be realized by using existing mature preparation device, has small modification on the existing process, may be well compatible with the existing preparation process, and therefore has the advantages of low manufacturing cost, easy process realization and the like. The embodiment lightens the screen window effect, improves the picture quality, and has practical application value and a good application prospect.

Based on the same inventive concept, an embodiment of the present application also provides a display apparatus, including the display substrate of the previous embodiment. The display apparatus may be any product or component with a display function such as a mobile phone, a tablet computer, a television, a display, a notebook computer, a digital photo frame, a navigator, or a head-mounted display apparatus.

Figure 7:
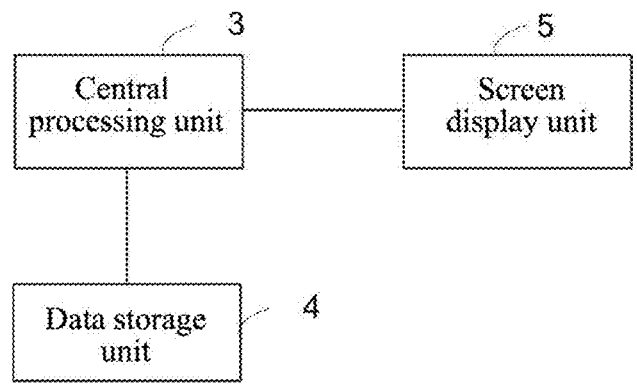
FIG. 7 is a schematic diagram of a display apparatus according to an embodiment.

In the following, a silicon-based OLED display apparatus will be taken as an example to explain the implementation process of image display in an embodiment of the present application. As shown in FIG. 7, the implementation of the present application provides a silicon-based OLED display apparatus, including a central processing unit 3, a data storage unit 4, and a screen display unit 5, wherein the central processing unit 3 is connected with the data storage unit 4 and the screen display unit 5. The central processing unit 3 is a control center of the silicon-based OLED display apparatus and may send commands to control the screen display. The data storage unit 4 realizes driving voltage data transmission, voltage information transmission, and storage, etc. The screen display unit 5 realizes the display of OLED images and video pictures, and includes the above display substrate. The central processing unit 3 sends out a control command, realizes the transmission of the control command through the data storage unit 4, drives the screen display unit 5 to realize display of images and video signals. When the screen display unit 5 displays the images and video signals, due to the function of the pinhole film structure layer, virtual images of pixels are displayed, so that the screen window effect is eliminated, the display stereoscopic effect of the picture is enhanced, and the experience and immersion feeling of VR/AR users are improved.

The following points need to be explained.

(1) The drawings of the embodiments of the present application only refer to the structures related to the embodiments of the present application, and other structures may refer to the common design.

(2) For the sake of clarity, in the drawings used to describe embodiments of the present application, the thickness of the layer or region is amplified or reduced, that is, the drawings are not drawn to actual scale. It will be understood that when an element such as a layer, film, region, or substrate is referred to as being "on" or "under" another element, the element may be "directly" "on" or "under" the other element, or intervening elements may be present.

(3) Without conflict, the embodiments of the present application and the features in the embodiments can be combined with each other to obtain new embodiments.

Although the embodiments disclosed in the present application are as the above, the contents are only embodiments for facilitating understanding the present application and are not used to limit the present application. Any person skilled in the field to which the present application pertains can make any modifications and variations in the forms and details of implementation without departing from the spirit and the scope disclosed in the present application, but the patent protection scope of the present application should still be subject to the scope defined by the appended claims.

What we claim is:

1. A display substrate, comprising: a base substrate, a light emitting structure layer disposed on the base substrate, a color filter layer comprising a plurality of sub-pixels and disposed on a light emitting side of the light emitting structure layer, and a pinhole thin film structure layer disposed on a light emitting side of the color filter layer, the pinhole thin film structure layer comprising a plurality of amplification structures, the amplification structures corresponding to the sub-pixels one by one, and an orthographic projection of the amplification structures on the base substrate being inside an orthographic projection of the sub-pixels corresponding to the amplification structures on the base substrate, and the amplification structures being configured to amplify images of the sub-pixels corresponding to the amplification structures;

wherein sub-pixel virtual images formed after adjacent amplification structures amplify the sub-pixels corresponding to the amplification structures are connected with each other.

2. The display substrate according to claim 1, wherein a section of the amplification structures is rectangular on a plane perpendicular to the base substrate.

3. The display substrate according to claim 2, wherein the section of the amplification structures is circular on a plane parallel to the base substrate.

4. The display substrate according to claim 2, wherein lines connecting centers of the amplification structures and centers of the sub-pixels corresponding to the amplification structures are perpendicular to the base substrate.

5. The display substrate according to claim 1, wherein a material of the amplification structures comprises titanium.

6. The display substrate according to claim 1, wherein the pinhole thin film structure layer further comprises a main body structure, the main body structure comprising via holes corresponding to the amplification structures one by one to accommodate the amplification structures, and the via holes being the same size as the amplification structures corresponding to the via holes.

7. The display substrate according to claim 6, wherein a refractive index of a material used for the main body structure is smaller than a refractive index of a material used for the amplification structures.

8. The display substrate according to claim 1, wherein the base substrate comprises a silicon substrate.

9. The display substrate according to claim 1, wherein the light emitting structure layer comprises a first electrode layer, a pixel driving circuit layer, an organic light emitting layer, a second electrode layer, and a first encapsulation layer sequentially disposed on the base substrate.

10. A display apparatus comprising the display substrate according to claim 1.

11. A preparation method of a display substrate, for preparing the display substrate according to claim 1, comprising:

forming a base substrate and forming a light emitting structure layer disposed on the base substrate;

forming a color filter layer comprising a plurality of sub-pixels and disposed on a light emitting side of the light emitting structure layer; and forming a pinhole thin film structure layer disposed on a light emitting side of the color filter layer, the pinhole thin film structure layer comprising a plurality of amplification structures, the amplification structures corresponding to the sub-pixels one by one, an orthographic projection of the amplification structures on the base substrate being inside an orthographic projection of the sub-pixels corresponding to the amplification structures on the base substrate, and the amplification structures being configured to amplify images of the sub-pixels corresponding to the amplification structures.

12. The preparation method of the display substrate according to claim 11, wherein a section of the amplification structures is rectangular on a plane perpendicular to the base substrate.

13. The preparation method of the display substrate according to claim 12, wherein the section of the amplification structures is circular on a plane parallel to the base substrate.

14. The preparation method of the display substrate according to claim 12, wherein lines connecting centers of the amplification structures and centers of the sub-pixels corresponding to the amplification structures are perpendicular to the base substrate.

15. The preparation method of the display substrate according to claim 11, wherein a material of the amplification structures comprises titanium.

16. The preparation method of the display substrate according to claim 11, wherein the pinhole thin film structure layer further comprises a main body structure, the main body structure comprising via holes corresponding to the amplification structures one by one to accommodate the amplification structures, and the via holes being the same size as the amplification structures corresponding to the via holes.

17. The preparation method of the display substrate according to claim 16, wherein a refractive index of a material used for the main structure is smaller than a refractive index of a material used for the amplification structures.

18. The preparation method of the display substrate according to claim 11, wherein the base substrate comprises a silicon substrate.

* * * * *